(12) United States Patent
Sole

(10) Patent No.: US 10,886,779 B2
(45) Date of Patent: Jan. 5, 2021

(54) METHOD AND DEVICE FOR MANAGING AN ELECTRICITY SUPPLY THROUGH AN ELECTRIC NETWORK AND FOR CONTROLLING AN ELECTRICAL SUPPLY TO A CONSUMER OF ELECTRICITY

(71) Applicant: Dr. Ing. h.c. F. Porsche Aktiengesellschaft, Stuttgart (DE)

(72) Inventor: Barry Sole, Stuttgart (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 86 days.

(21) Appl. No.: 16/331,758

(22) PCT Filed: Jul. 4, 2017

(86) PCT No.: PCT/EP2017/025195
§ 371 (c)(1),
(2) Date: Mar. 8, 2019

(87) PCT Pub. No.: WO2018/050288
PCT Pub. Date: Mar. 22, 2018

(65) Prior Publication Data
US 2019/0245381 A1      Aug. 8, 2019

(30) Foreign Application Priority Data
Sep. 19, 2016   (DE) .................. 10 2016 117 574

(51) Int. Cl.
*H02J 13/00* (2006.01)
*G05B 17/02* (2006.01)
(Continued)

(52) U.S. Cl.
CPC ........ *H02J 13/00007* (2020.01); *B60L 53/60* (2019.02); *G05B 17/02* (2013.01); *H02J 3/14* (2013.01); *H02J 13/0013* (2013.01); *G01R 19/2513* (2013.01); *H02J 3/26* (2013.01); *H02J 3/32* (2013.01); *H02J 3/383* (2013.01); *H02J 2310/14* (2020.01); *Y02B 70/30* (2013.01);
(Continued)

(58) Field of Classification Search
CPC .... G05B 17/02; H02J 13/0013; H02J 13/002; H02J 3/14; H02J 3/26; H02J 3/32; H02J 3/383; H02J 13/00004; H02J 13/00006; H02J 13/00007; H02J 2003/143
See application file for complete search history.

(56) References Cited

U.S. PATENT DOCUMENTS

| 5,927,598 A | 7/1999 | Broe | |
| 2003/0212513 A1* | 11/2003 | Vandevanter | H02J 13/00001 702/57 |

(Continued)

FOREIGN PATENT DOCUMENTS

| DE | 19621543 A1 | 12/1997 |
| DE | 102014214906 A1 | 2/2015 |

OTHER PUBLICATIONS

International Search Report and Written Opinion for International Application No. PCT/EP2017/025195, dated Oct. 9, 2017—10 pages.

*Primary Examiner* — Chun Cao
(74) *Attorney, Agent, or Firm* — RatnerPrestia

(57) ABSTRACT

A method for controlling a supply of at least one load with voltage and/or electric current through an electric network.

13 Claims, 3 Drawing Sheets

(51) Int. Cl.
  *H02J 3/14* (2006.01)
  *B60L 53/60* (2019.01)
  *H02J 3/32* (2006.01)
  *H02J 3/38* (2006.01)
  *H02J 3/26* (2006.01)
  *G01R 19/25* (2006.01)

(52) U.S. Cl.
  CPC ............ *Y02B 70/3225* (2013.01); *Y02B 90/20* (2013.01); *Y02E 10/56* (2013.01); *Y02E 40/50* (2013.01); *Y02E 40/70* (2013.01); *Y04S 10/123* (2013.01); *Y04S 20/12* (2013.01); *Y04S 20/222* (2013.01); *Y04S 20/242* (2013.01); *Y04S 40/121* (2013.01)

(56) References Cited

U.S. PATENT DOCUMENTS

2010/0191487 A1*  7/2010  Rada ................ G01D 4/004
                                                    702/60
2013/0035887 A1   2/2013  Fan
2014/0316599 A1   10/2014 Tomita et al.
2016/0049790 A1   2/2016  Wordsworth et al.

* cited by examiner

METHOD AND DEVICE FOR MANAGING AN ELECTRICITY SUPPLY THROUGH AN ELECTRIC NETWORK AND FOR CONTROLLING AN ELECTRICAL SUPPLY TO A CONSUMER OF ELECTRICITY

CROSS-REFERENCE TO RELATED APPLICATIONS

This U.S. national phase patent application claims priority to PCT International Patent Application No. PCT/EP2017/025195, filed Jul. 4, 2017, which claims priority to German Patent Application No. DE 10 2016 117 574.9, filed Sep. 19, 2016, the contents of each application being incorporated by reference herein in its entirety.

FIELD OF THE INVENTION

The present invention relates to a method for controlling a supply of at least one consumer with voltage and/or electric current through an electric network. The present invention also relates to a management unit for an electric network.

BACKGROUND OF THE INVENTION

When connecting an electric consumer to an electric network, it may be the case that a topology of phases of the consumer that is internally used by the consumer does not correspond to a topology to the consumer used by a management unit to control a flow of electric current through the electric network or a voltage applied to respective phases of the electric network. Contradictory topologies of the consumer and the control unit may result in problems when supplying the consumer with electric current or voltage, that is to say with electric energy, through the electric network.

For example, it may be the case that an electrically driven vehicle having a three-phase charger which can be asymmetrically supplied with electric current of different intensity on all three phases is supplied by a management unit of a charging station with information relating to the current intensity with which the vehicle can be charged at most on which phase. In order to dynamically change a current flow on a respective phase and to transmit instructions to set a corresponding charging current to the charger, it is necessary for the management unit and the charger to have an identical understanding of a topology of the phases, that is to say of an assignment or numbering of the phases. Furthermore, in order to optimally supply consumers through an electric network, it is necessary for a management unit of the electric network to have knowledge of a location of the consumer in the electric network, that is to say knowledge of the location at which or on which phases of the electric network which consumers are arranged.

A method for stabilizing an energy distribution network is disclosed in the German document DE 10 2014 214 906 A1.

The US document US 2014 031 65 99 A1 discloses intelligent control of consumers connected to an energy distribution network.

The US document US 2016 004 97 90 A1 discloses a system for storing and distributing electric energy.

The US document U.S. Pat. No. 5,927,598 A discloses a method for monitoring a phase shift of consumers connected to an electric network.

SUMMARY OF THE INVENTION

Against this background, an object of the present invention is to provide a method which makes it possible to dynamically manage electric energy conducted via respective electric lines of an electric network on the basis of a current topology of the electric network.

In order to achieve the object mentioned above, a method for controlling a supply of at least one consumer with voltage and/or electric current through an electric network is presented, wherein the electric network comprises a multiplicity of phases, and wherein respective phases of the multiplicity of phases used to supply the at least one consumer are determined by transmitting at least one predefined individual consumption pattern assigned to the at least one consumer to the at least one consumer by means of a communication interface, and wherein the at least one consumer is operated according to the at least one consumption pattern, wherein, at the same time as the operation of the at least one consumer according to the at least one consumption pattern, changes in a voltage and/or in a flow of electric current through the respective phases of the multiplicity of phases are captured by means of respective sensors assigned to the respective phases, and wherein a map of the electric network is created on the basis of the changes in the voltage and/or in the flow of electric current which are captured using the sensors, and wherein the at least one consumer is supplied with voltage and/or electric current on the basis of the created map.

Configurations of the presented invention emerge from the description and the dependent claims.

The presented method is used, in particular, to dynamically adapt a supply of electric consumers of an electric network with electric energy. For this purpose, the invention provides for a map of the electric network, that is to say of an energy distribution network for distributing electric energy, to be created, on the basis of which map an intensity of electric energy, that is to say of electric current or voltage, which is made available to a respective electric consumer via a respective phase or a respective electric line of the electric network is set. This means that a map indicating, for example, a number and a location of respective consumers to be supplied with electric energy through an electric network and/or a phase assignment of the consumers is created according to the presented method.

In order to determine the map provided according to aspects of the invention, the invention provides for respective consumers connected to an electric network to be examined with respect to their location and/or their phase assignment. For this purpose, provision is made for at least one consumption pattern, which relates to or specifies changes in a voltage and/or in a flow of electric current, to be transmitted to a respective consumer by means of a communication interface included in the electric network, with the result that the consumer is configured to generate a sequence of switching states which results in exactly the changes in the voltage and/or in the flow of electric current predefined or defined by the at least one consumption pattern occurring in respective phases or electric lines assigned to the consumer.

With the aid of sensors which are assigned to respective phases or corresponding electric lines of an electric network and are intended to determine changes in a voltage applied to the respective phases or in an electric current flowing through the respective phases, it is possible to capture respective changes in the voltage applied to the respective electric lines or in the electric current flowing through the respective phases, which changes are caused by a consumer according to the at least one consumption pattern provided according to aspects of the invention. Accordingly, in the event of correspondence between changes in the voltage applied to the phase or in the electric current flowing through the phase which are measured on a respective phase of the electric network and respective changes in voltage and electric current caused by a consumption pattern currently activated or set in a consumer, it can be inferred that the respective phase on which the changes in the voltage or in the electric current were measured can be assigned to the consumer in which the consumption pattern has been activated or set.

In the context of the present invention, a consumption pattern can be understood as meaning a pattern of voltage and/or current fluctuations. A consumption pattern may specify, for example, a particular square-wave profile of a voltage and/or a sinusoidal profile of a current intensity or vice versa and can be set in a consumer using a sequence of corresponding switching states.

One possible configuration of the presented method provides for a sensor for capturing a voltage applied to a respective phase and/or an electric current flowing through a respective phase to be assigned to each phase of the multiplicity of phases of the electric network.

In order to capture respective changes in a respective voltage applied to respective phases and/or in a respective electric current flowing through a respective phase and possibly to be able to assign them to a respective consumption pattern, provision is made, in particular, for all phases or all connection points of electric lines to respective consumers of an electric network to be monitored by means of respective sensors.

Provision is made, in particular, for a respective consumption pattern to be transmitted to a respective consumer which is newly or freshly connected to a respective electric network, with the result that the consumer consumes current or voltage according to the consumption pattern and its location or its phase assignment can be accordingly identified.

In the context of the present invention, a location can be understood as meaning a position of a connection to an electric network, for example a particular charging station or power socket.

In the context of the present invention, a phase assignment can be understood as meaning an assignment of a consumer to a phase of an electric network. It is conceivable for a consumer to have one location but a plurality of phase assignments, wherein the location and, as a result, also the phase assignment can change over time in the case of mobile consumers, for example.

With knowledge of a location of a consumer in a respective electric network, the consumer can be assigned to a respective subsystem, for example a voltage monitor, with the result that management operations, for example disconnection of a supply of consumers if the electric network is overloaded, can be carried out possibly on the basis of an assignment of the consumer to the voltage monitor and the supply of those consumers which are not assigned to a voltage monitor is specifically disconnected, for example.

Another possible configuration of the presented method provides for the map to indicate how much voltage and/or how much electric current is requested by the at least one consumer via which phase of the electric network and/or at which locations which consumers are connected to the electric network.

The map provided according to aspects of the invention is used, in particular, to map a topology of a respective electric network and/or a phase assignment of respective consumers connected to the electric network.

Another possible configuration of the presented method provides for a communication interface from the following list of communication interfaces between a control device configured to carry out a method according to aspects of the invention and the at least one consumer to be selected as the communication interface: an electric cable, an Ethernet cable, a Powerline Communication connection, a WLAN connection, a Bluetooth connection, a Z-Wave connection or a ZigBee connection.

In order to supply a respective consumer using a respective consumption pattern and to accordingly configure it to carry out switching operations which cause a voltage change corresponding to the consumption pattern and/or a change in the electric current flowing through the phase to arise on at least one phase assigned to the respective consumer, any technically suitable communication interface for transmitting information to a consumer is suitable. So-called "Powerline Communication", in which information is transmitted via a power cable or an electric line which is originally intended to transmit electric energy, is suitable in particular since an additional hardware interface, for example a router or a Bluetooth module, can be dispensed with using "Powerline Communication".

If the at least one consumer can have a different consumption behavior on different phases, that is to say consumes a different amount of electric current or voltage, another possible configuration of the presented method provides for at least one specific consumption pattern to be assigned to a respective phase of the consumer and to be transmitted to the at least one consumer, wherein a topology of the phases which is stored in a control device included in the at least one consumer is inferred on the basis of respective changes in voltages and/or current flows present in the phases, which changes are captured during operation of the at least one consumer according to the consumption patterns.

Since a consumer can use a topology or a designation of phases designed independently of a respective electric network supplying the consumer, it may be the case that the electric network designates the phases of the consumer differently or enters them into a topology of the electric network differently than provided in the topology of the consumer. Accordingly, it may be the case that a control command which is transmitted from the electric network to the consumer and states that consumption of electric energy on a phase "3" should be reduced, for example, is implemented incorrectly from the point of view of the electric network since the consumer controls the phase "3" designated from its point of view. If the phase "3" from the point of view of the consumer and the phase "3" from the point of view of the electric network do not correspond, the control command is implemented on the incorrect phase.

In order to avoid implementation of control commands on incorrect phases, a configuration of the presented method provides for an internal topology of a respective consumer to be determined. For this purpose, different consumption patterns are transmitted to the consumer according to its number of phases and the different consumption patterns are assigned to a respective phase by the electric network. If, when the consumer is setting the consumption patterns, the electric network identifies that a consumption pattern is not executed on a phase accordingly predefined by the electric network, it is certain that the topology used by the electric network and the topology used by the consumer do not correspond. Accordingly, the electric network changes its topology or its map and checks the consumer again using different consumption patterns for different phases. This operation is repeated until the consumption patterns are measured on the phases predefined by the electric network and the topology of the electric network accordingly corresponds to the internal topology of the consumer.

Another possible configuration of the presented method provides for a control command which results in a changed transmission power of voltage and/or electric current via at least one phase of the phases connected to the at least one consumer to be transmitted to the consumer.

In order to regulate a transmission power of an electric network and, for example, to prevent overloading, provision is made for the electric network to transmit a control command to at least one consumer to be supplied with electric energy by the electric network, which control command configures the consumer to request only as much electric energy as can be certainly provided by the electric network via respective phases of the consumer.

Another possible configuration of the presented method provides for each sensor of the electric network to be assigned to a connection for connecting the at least one consumer to the electric network.

As a result of a known location of sensors in an electric network, respective consumption patterns captured by the sensors can be allocated to a location corresponding to the sensors, with the result that a location of a respective consumer generating the consumption patterns in the electric network can be inferred on the basis of the consumption patterns captured by the respective sensors. In this case, the location on phases can also relate, however, to nodes of electric lines of the electric network.

In order to assign respective phases of an electric network to respective consumers and to accordingly infer a topology of the electric network, provision is made for a respective phase to be assigned to each sensor for capturing voltage and/or current flow.

The present invention also relates to a management unit for an electric network having a multiplicity of phases and a control device, wherein the control device is configured to determine respective phases of the multiplicity of phases used to supply at least one consumer by transmitting at least one predefined individual consumption pattern assigned to the at least one consumer to the at least one consumer by means of a communication interface and transmitting a control command to operate the at least one consumer according to the at least one consumption pattern to the at least one consumer, and wherein the control device is also configured to capture changes in a voltage and/or in a flow of electric current through the respective phases of the multiplicity of phases by means of respective sensors assigned to the respective phases at the same time as operation of the at least one consumer according to the at least one consumption pattern and to create a map of the electric network on the basis of the changes in the voltage and/or in the flow of electric current which are captured by means of the sensors and to set a supply of the at least one consumer with voltage and/or electric current on the basis of the created map.

The presented management unit is used, in particular, to carry out the presented method.

One possible configuration of the presented management unit provides for the control device to be part of a charging station for supplying at least one vehicle with electric energy.

Both the presented management unit and the presented method are suitable, in particular, for managing an infrastructure of charging poles for supplying electrically driven vehicles with electric energy.

BRIEF DESCRIPTION OF THE DRAWING

Further advantages and configurations of the invention emerge from the description and the accompanying drawings.

It goes without saying that the features mentioned above and the features yet to be explained below can be used not only in the respectively stated combination but also in other combinations or alone without departing from the scope of the present invention.

DETAILED DESCRIPTION OF THE INVENTION

Figure 1:
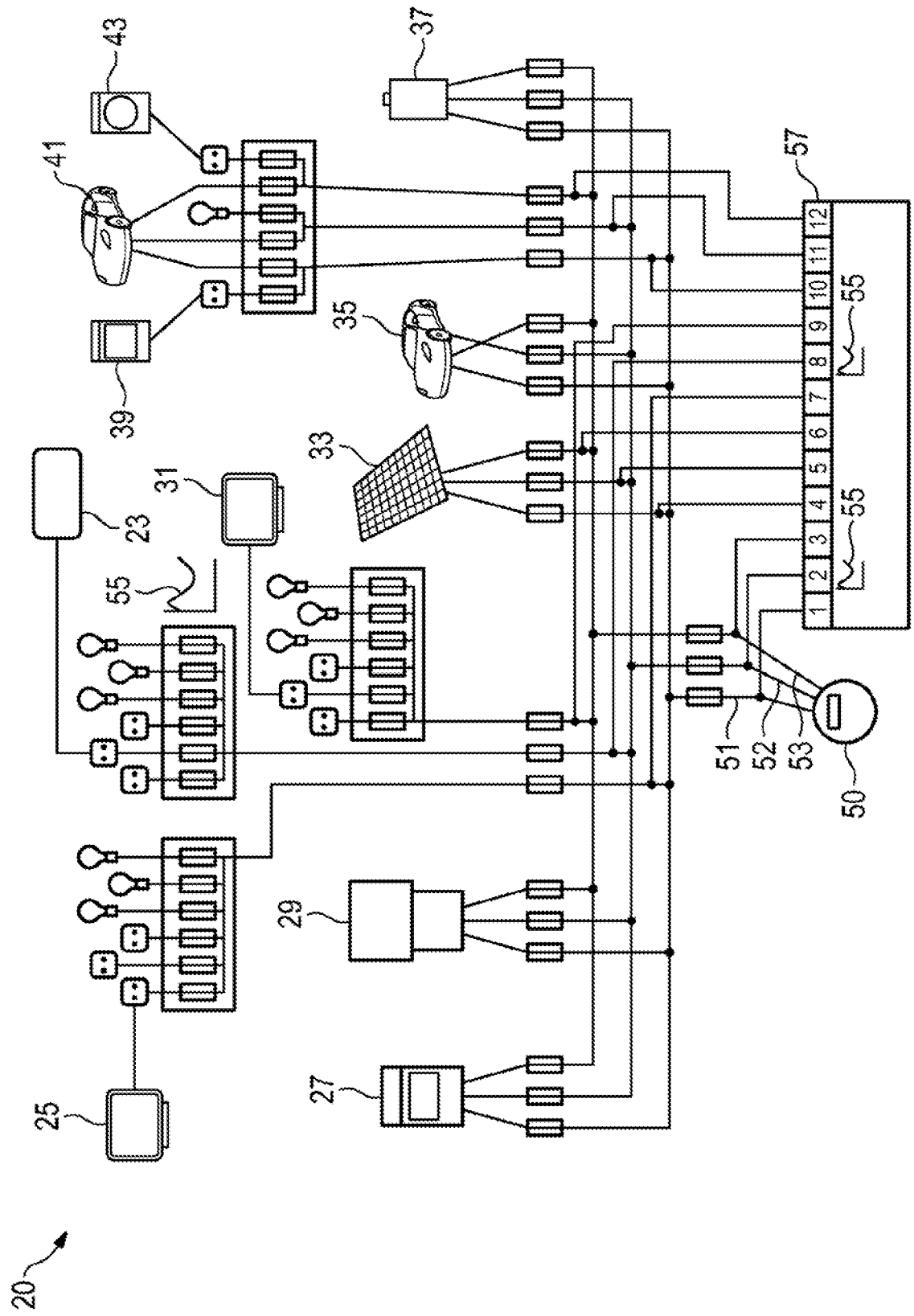
FIG. 1 shows a schematic illustration of an electric network which is managed according to one possible configuration of the method according to aspects of the invention.

FIG. 1 illustrates an electric network 20 having a multiplicity of consumers 23, 25, 27, 29, 31, 33, 35, 37, 39, 41 and 43. The electric network 20 is fed via a connection 50 having three phases 51, 52 and 53.

In order to create a map of a topology of the electric network 20 and to determine, for example, a location or a phase, used for supply, of a consumer 23 freshly connected to the electric network 20, a management unit of the electric network 20 transmits an individual consumption pattern 55, that is to say a consumption pattern specifically designed for the consumer 23, or a corresponding control command, which results in the consumer 23 being configured to consume electric energy in such a manner that a pattern according to the consumption pattern 55 is established on a respective phase 52 supplying the consumer 23 with electric energy, to the consumer 23 by means of a communication interface, for example a WLAN interface. The consumer 23 is a consumer configured to consume electric energy from only one phase, as is typical of an air-conditioning system, for example.

A diagram 57 shows respective signals measured by sensors 1 to 12. Sensor 2 and sensor 8 which are both assigned to the phase 52 each measure a consumption of electric energy, that is to say electric current or voltage, according to the consumption pattern 55, whereas the further sensors 1, 3 to 7 and 8 to 12 do not measure or measure only a constant consumption of electric energy.

Since the management unit of the electric network 20 knows the phase on which the sensors 2 and 8 measure, the phase 52 which is assigned to the sensors 2 and 8 can be assigned to the consumer 23 on the basis of the consumption pattern 55 which is measured by the sensors 2 and 8 and, on account of its individuality, is most likely to come from the consumer 23. Accordingly, the management unit of the electric network 20 obtains knowledge of the phase to which the consumer 23 is connected, with the result that a supply of the consumer 23 with electric energy is to be controlled or can be controlled via the phase 52.

Furthermore, on account of the consumption pattern 55 captured by the sensor 8, the management unit of the electric network 20 obtains knowledge of where in the electric network 20 the consumer 23 is located, namely at a connection which is monitored by the sensor 8.

In order to assign a respective consumer 23, 25, 27, 29, 31, 33, 35, 37, 39, 41 or 43 to a respective phase 51, 52 or 53, the sensors 1 to 12 are assigned to permanently respective phases 51, 52 or 53 or respective electric lines connected to the phases 51, 52 or 53. This means that the sensors 1, 4, 7 and 10 measure changes in a current flow and/or voltage fluctuations on the phase 51 and the sensors 2, 5, 8 and 11 furthermore measure changes in a current flow and/or voltage fluctuations on the phase 52 and the sensors 3, 7, 9 and 12 measure changes in a current flow and/or voltage fluctuations on the phase 53.

Figure 2:
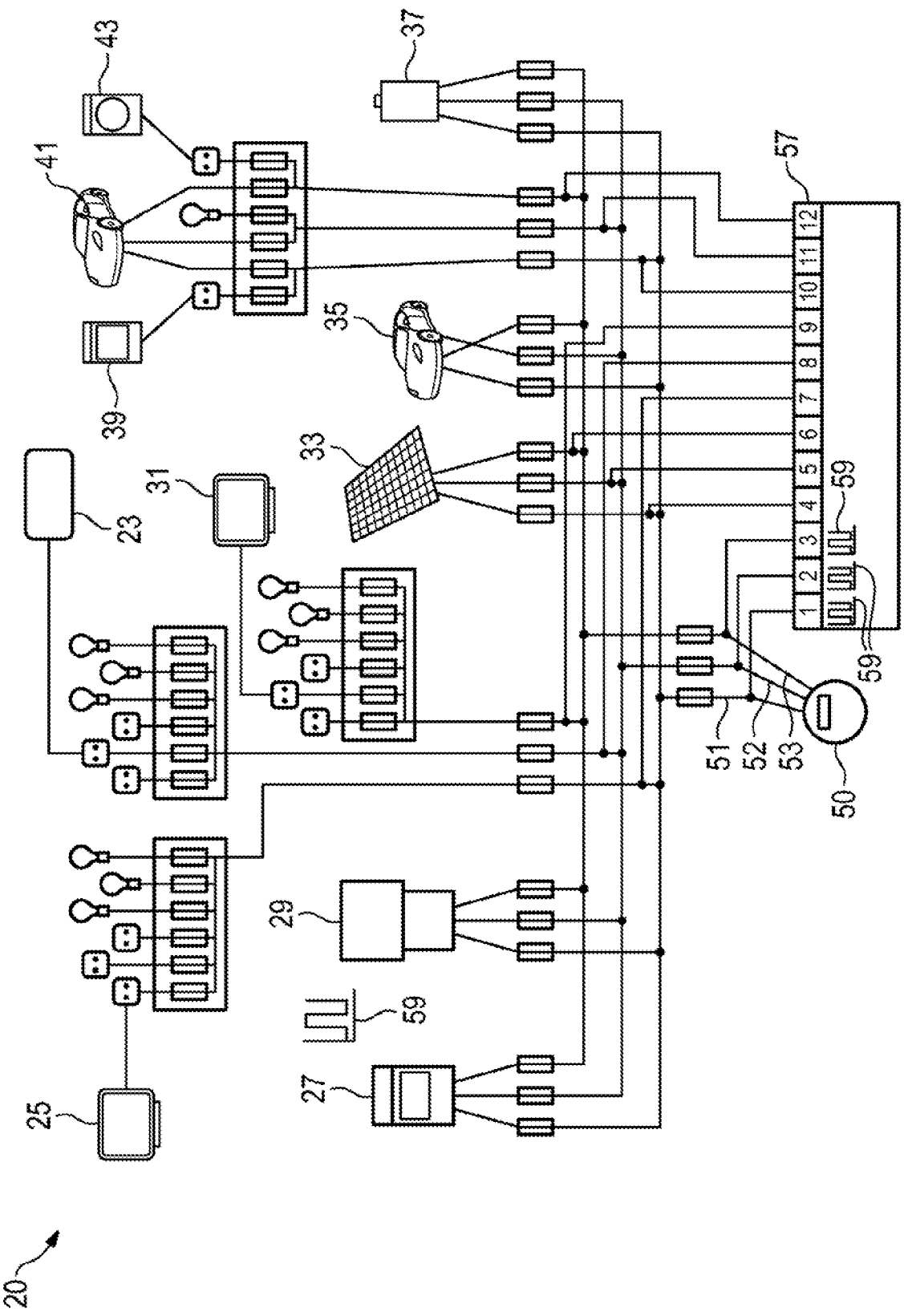
FIG. 2 shows a schematic illustration of the electric network from FIG. 1 which is managed according to another possible configuration of the method according to aspects of the invention.

In FIG. 2, the consumer 29 was freshly connected to the electric network 20. The consumer 29 is configured to obtain electric energy in a uniformly distributed manner via three different phases.

In order to determine a location of the consumer 29 in the electric network 20, the management unit of the electric network 20 transmits a control command to the consumer 29 via a Bluetooth interface, which control command configures the consumer 29 to consume electric energy according to a consumption pattern 59. As soon as the consumer 29 is switched according to the control command, sensors 1 to 3 measure changes in a current flow and/or in a voltage according to the consumption pattern 59 on the phases 51, 52 and 53. Since the further sensors 4 to 12 do not measure any signals corresponding to the consumption pattern 59, the location of the consumer 29 can be inferred according to the topology shown in FIG. 2.

Figure 3:
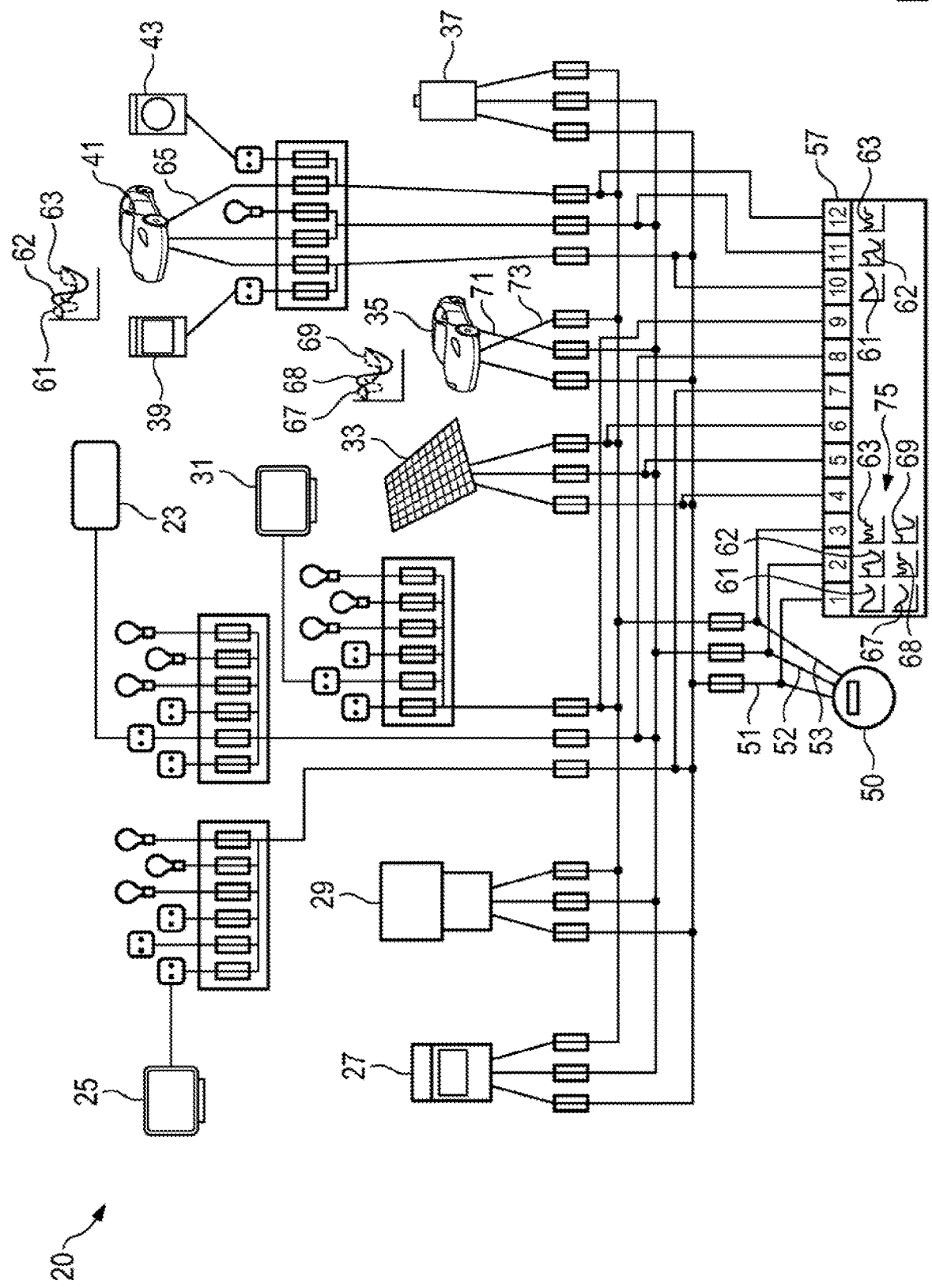
FIG. 3 shows a schematic illustration of the electric network from FIG. 1 which is managed according to yet another possible configuration of the method according to aspects of the invention.

In FIG. 3, a first electrically driven vehicle 41 and a second electrically driven vehicle 35 were freshly connected to the electric network 20. Both the first vehicle 41 and the second vehicle 35 are configured to consume electric energy independently of one another, that is to say in an asymmetrically distributed manner for example, via three different phases.

In order to determine a location of the first electrically driven vehicle 41 and an internal assignment of phases of the first vehicle 41, that is to say an internal topology of the first vehicle 41, the management unit of the electric network 20 transmits three different consumption patterns 61, 62 and 63 to the first vehicle 41 by means of a Powerline Communication connection. This means that a control command to set the consumption patterns 61, 62 and 63 on permanently predefined phases 51, 52 and 53 is transmitted to the first vehicle 41 via an electric line 65 which is selected as the communication line and can also be used, for example, to transmit electric current or voltage. Accordingly, the first vehicle 41 is switched in such a manner that the consumption patterns 61, 62 and 63 are established on respective phases connected to the first vehicle 41 or corresponding electric lines. Since the sensors 1 and 10 capture the consumption pattern 61, the sensors 2 and 11 capture the consumption pattern 62 and the sensors 3 and 13 capture the consumption pattern 63, it can be inferred therefrom that the first vehicle 41 is connected to the electric network 20 at the location corresponding to the topology illustrated in FIG. 3. It can also be inferred that an internal assignment of the consumption patterns 61, 62 and 63 to the respective phases of the first vehicle 41 has been carried out on the basis of an internal map of the phases of the first vehicle 41, which map corresponds to a map of the phases of the first vehicle 41, as is used by the management unit of the electric network 20.

Control commands to generate a consumption pattern 67 on the phase 51, a consumption pattern 68 on the phase 52 and a consumption pattern 69 on the phase 53 were transmitted to the second vehicle 35. The consumption patterns 67, 68 and 69 differ from the consumption patterns 61, 62 and 63 in terms of their shape in order to distinguish the first vehicle 41 from the second vehicle 35.

Since the consumption pattern 69 was measured by the sensor 2 and the consumption pattern 68 was measured by the sensor 3, which is highlighted by the marking 75, it can be assumed that an internal topology of the phases of the second vehicle 35 does not correspond to a topology used by the management unit of the electric network 20, as indicated by crossed electric lines 71 and 73. Accordingly, the management unit of the electric network 20 changes its internal map of the topology of the electric network 20 according to the specification of the second vehicle 35 and repeats the operation until the assignment of the consumption patterns 67, 68 and 69 to the phases 51, 52 and 53 by the second vehicle 35 corresponds to the specifications of the management unit of the electric network 20.

The invention claimed is:

1. A method for controlling a supply of at least one consumer with voltage, electric current or both voltage and electric current through an electric network, wherein the electric network comprises a multiplicity of phases, the method comprising:
determining (i) respective phases of the multiplicity of phases used to supply {i-} the at least one consumer, (ii) and a location of the at least one consumer in the electric network, by transmitting at least one predefined individual consumption pattern assigned to the at least one consumer to the at least one consumer by way of a communication interface,
operating the at least one consumer according to the at least one consumption pattern,
capturing, at the same time as the operating step, changes in (i) a voltage, (ii) a flow of electric current, or (iii) both the voltage and flow of electric current through the respective phases of the multiplicity of phases by way of respective sensors assigned to the respective phases,
creating a map of the electric network on a basis of the changes which are captured using the sensors, and
supplying the at least one consumer with the voltage, the electric current or both the voltage and the electric current on the basis of the created map.

2. The method as claimed in claim 1, further comprising assigning a sensor for capturing (a) a voltage applied to a respective phase, (b) an electric current flowing through a respective phase, or (c) both (a) and (b) to at least each phase of the multiplicity of phases of the electric network.

3. The method as claimed in claim 1, in which the step of creating a map comprises creating the map to indicate how much voltage, electric current or both voltage and electric current is requested by the at least one consumer via which phase of the electric network or at which location the at least one consumer is connected to the electric network.

4. The method as claimed in claim 1, wherein a communication interface between a control device, which is configured to carry out the method, and the at least one consumer is an electric cable, an Ethernet cable, a Powerline Communication connection, a WLAN connection, a Bluetooth connection, a Z-Wave connection or a ZigBee connection.

5. The method as claimed in claim 1, in which the at least one consumption pattern comprises a sequence of current-consuming switching operations, voltage-consuming switching operations, or both current-consuming switching operations and voltage-consuming switching operations.

6. The method as claimed in claim 1, wherein if the at least one consumer has a different consumption behavior for different phases, the method comprises assigning at least one specific consumption pattern to a respective phase, transmitting the at least one specific consumption pattern to the at least one consumer, and inferring a topology of the phases, which topology is stored in a control device included in the at least one consumer, on the basis of respective changes in voltages, current flows or both voltages and current flows present in the phases, which changes are captured during operation of the at least one consumer according to the consumption patterns.

7. The method as claimed in claim 6, wherein if the topology stored in the control device included in the at least one consumer does not match the map determined on the basis of the changes which are captured by the sensors, then the method further comprises modifying the map according to the topology stored in the control device and carrying out the method again on the basis of the modified map.

8. The method as claimed in claim 6, further comprising transmitting a control command, which results in a changed transmission power of voltage, electric current or both voltage and electric current via at least one phase of the phases connected to the at least one consumer, to the at least one consumer.

9. The method as claimed in claim 1, further comprising assigning each sensor of the electric network to a specific phase of a connection for connecting the at least one consumer to the electric network.

10. The method as claimed in claim 1, wherein the consumer is connected to at least two different sensors, one of the sensors being indicative of location, and the other sensor being indicative of the phase.

11. A management unit for an electric network having a multiplicity of phases and a control device,
wherein the control device is configured to determine (i) respective phases of the multiplicity of phases used to supply at least one consumer and (ii) a location of the at least one consumer in the electric network by transmitting at least one predefined individual consumption pattern assigned to the at least one consumer to the at least one consumer by way of a communication interface and transmitting a control command to operate the at least one consumer according to the at least one consumption pattern to the at least one consumer,
wherein the control device is also configured to capture changes in voltage, flow of electric current or both the voltage and the flow of electric current through the respective phases of the multiplicity of phases using respective sensors assigned to the respective phases at the same time as operation of the at least one consumer according to the at least one consumption pattern, and
wherein the control device is also configured to create a map of the electric network on the basis of the changes in the voltage or electric current which are captured by the sensors and to set a supply of the at least one consumer with voltage, electric current or both voltage and electric current on the basis of the created map.

12. The management unit as claimed in claim 11, wherein the control device is part of a charging station for supplying at least one vehicle with electric energy.

13. The management unit as claimed in claim 11, wherein the consumer is connected to at least two different sensors, one of the sensors being indicative of location, and the other sensor being indicative of the phase.

\* \* \* \* \*